United States Patent [19]

Frank et al.

[11] Patent Number: 5,213,451
[45] Date of Patent: May 25, 1993

[54] APPARATUS AND METHOD OF AUTOMATICALLY SEPARATING STACKED WAFERS

[75] Inventors: Walter Frank, Burgkirchen, Fed. Rep. of Germany; Albert Pemwieser, Ach; Gerhard Spatzier, Eggelsberg, both of Austria

[73] Assignee: Wacker-Chemitronic Gesellschaft fur Elektronik-Grundstoffe mbH, Burghausen, Fed. Rep. of Germany

[21] Appl. No.: 818,553

[22] Filed: Jan. 9, 1992

[30] Foreign Application Priority Data

Jan. 10, 1991 [DE] Fed. Rep. of Germany ....... 4100526

[51] Int. Cl.⁵ ............................................. B65G 51/03
[52] U.S. Cl. ...................................... 406/72; 406/86; 406/88
[58] Field of Search ............... 406/72, 147, 73, 84, 406/86, 88, 108, 22; 271/5, 97, 195

[56] References Cited

U.S. PATENT DOCUMENTS

| | | | |
|---|---|---|---|
| 3,198,515 | 8/1965 | Pitney | 406/86 X |
| 3,411,829 | 11/1968 | Albright | 406/147 X |
| 3,645,581 | 2/1972 | Lasch, Jr. et al. | 406/88 X |
| 3,930,684 | 1/1976 | Lasch, Jr. et al. | 406/87 X |
| 4,236,851 | 12/1980 | Szasz | 406/86 X |
| 4,278,366 | 7/1981 | Loveless et al. | 406/88 |
| 4,315,705 | 2/1982 | Flint | 406/88 X |
| 4,690,591 | 9/1987 | Nagashima et al. | 406/88 |
| 5,108,513 | 4/1992 | Muller et al. | |

FOREIGN PATENT DOCUMENTS 209319 8/1990 Japan ..................... 406/84

OTHER PUBLICATIONS

Rajac, IBM Technical Disclosure Bulletin, vol. 17, No. 9, Feb. 1975, pp. 2703-2704, "Article transfer/cleaning-/inspection station".

Kirk-Othmer Encyclopedia of Chemical Technology, vol. 17, pp. 864-865.

Primary Examiner—Russell D. Stormer
Assistant Examiner—James M. Kannofsky
Attorney, Agent, or Firm—Collard & Roe

[57] ABSTRACT

The separation of thin disk-type workpieces from a stack has, as a rule, hitherto been carried out by hand. An apparatus and a corresponding method are now provided which make it possible to lift the wafer off the stack without mechanical contact, and also to convey the separated wafers to the tray and to introduce them in an automated way without damage. In this method, a stack of disk-type workpieces is introduced into a wafer magazine with a feed unit which brings the uppermost wafer of the wafer stack into the sphere of action of a fluid medium which emerges under pressure in a preferred direction from a nozzle system. A dam makes it possible to remove a single wafer. The apparatus and the method make possible separation without damage while increasing the yield. In conjunction with a conveying apparatus, an apparatus for tray filling processing lines can be built up for automatically treating disk-type workpieces without damage.

6 Claims, 1 Drawing Sheet

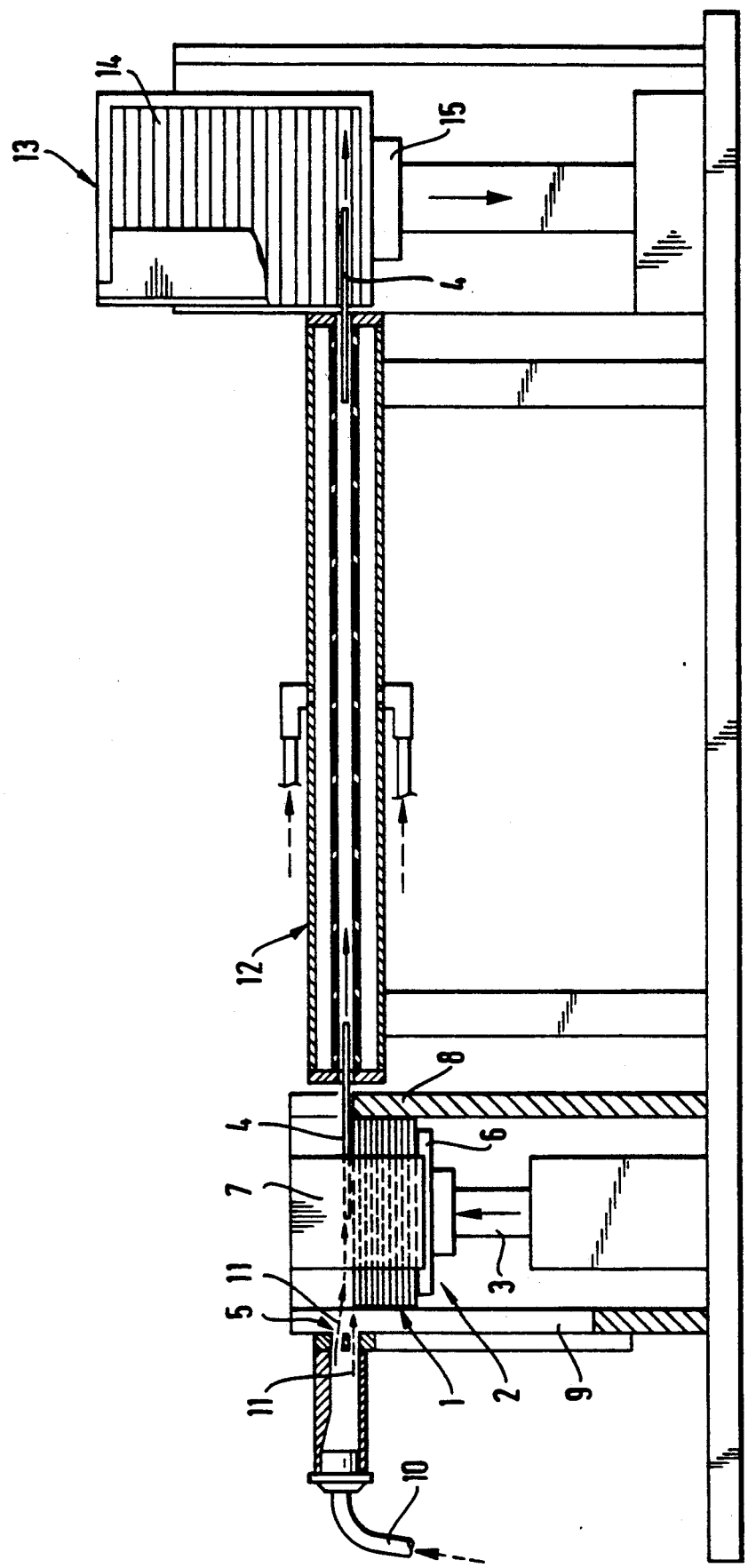

APPARATUS AND METHOD OF AUTOMATICALLY SEPARATING STACKED WAFERS

BACKGROUND OF THE INVENTION

1. Field of the Invention

The present invention relates to an apparatus for separating disk-type workpieces, in particular semiconductor wafers, from a wafer stack. It furthermore relates to a method of separating disk-type workpieces.

2. The Prior Art

The production of single-crystal or polycrystalline semiconductor wafers, for example composed of silicon or of compound semiconductors such as gallium arsenide or indium phosphide, requires the sawing of rod-shaped or block-shaped single-crystal or polycrystalline workpieces. In this operation, use is made, in particular, of wire frame saws with which up to several hundred thin single-crystal or polycrystalline wafers are simultaneously cut from an ingot or block of the semi-conductor material in one sawing operation. This then produces, after the sawing operation, a stack of these thin wafers which may be contaminated with sawdust or sawing fluid and which then have to be removed individually and introduced into a product carrier (wafer magazine, tray) for further treatment. This operation is normally carried out by hand.

In a similar manner, wafer populations existing in stacked form are produced on sawing single-crystal workpieces, for example ingots, into wafers and may also be encountered in further phases of the treatment process, for example, during lapping, etching or polishing steps. In the stack, the wafers may exist in essentially clean form or appreciably contaminated form, for example, due to sawdust, abrasion or oil.

The separation of the wafers is necessary in order for example to be able to carry out a further treatment of the surface. Such treatment operations can only be carried out completely and cleanly if both surfaces are readily accessible for the treatment agent, for example cleaning, coating or etching solutions, polishing or lapping tools or gases for reacting with the surface. For this purpose, the individual wafers are introduced, for example, into processing trays.

In particular, if the wafers have a small thickness of usually only up to approximately 200 μm and consequently have a great fragility, separation by hand is very difficult and unpleasant work. The low mechanical strength of the wafers results in losses due to breakage. Since extremely high requirements in relation to the cleanliness and perfection of the surface are imposed on semiconductor material, the performance of this work by hand is also a reason for contamination and damage, for example, due to scratches, which should be avoided.

Attempts at automation have hitherto not been successful. Thus, removing the wafers from the stack by mechanical means (such as, for instance, vacuum suction devices) fails because of the adhesive forces between the wafers, which frequently cause breakage losses. In addition, a mechanical contact with the wafer, which results in contaminants and defects on the wafer surface, is necessary.

Contaminants of the type described above on the wafer surface, for example as a result of sawdust, abrasion or oil, are a further problem with which the previous systems did not solve. Thus, in the case of dried wafers, contaminants result in sticking together and, consequently, in difficulties occurring during separation while moist or sticky wafers contaminated with solid constituents result in lack of cleanliness and, consequently, unreliability of the separating equipment. In all cases, the probability of damage is greater in the case of contaminated wafers. In addition, the opinion was held that the adhesive forces between the wafers are too strong for an automatic separation to be carried out, since these forces can even be utilized for some processes, for instance, bonding.

SUMMARY OF THE INVENTION

It is an object of the present invention to provide an apparatus which avoids these disadvantages and makes it possible to lift the wafers automatically off the wafer stack without mechanical contact and also, optionally, to convey the separated wafers to a wafer magazine (tray) and introduce them without damage into the tray. At the same time, a first cleaning of the wafers polluted with residues of the sawing operation should optionally also be carried out.

It is an additional object to provide a method embodying such steps.

The above objects are achieved in accordance with the present invention by providing an apparatus for separating disk-type workpieces from a wafer stack utilizing a fluid medium having a sphere of action, which comprises a wafer magazine for receiving the wafer stack having a feed unit which brings the uppermost wafer of the wafer stack into the sphere of action of the fluid medium, a nozzle system having an outlet through which said fluid medium emerges under pressure in a preferred direction, and a dam means for precisely separating one wafer from the wafer stack.

In addition, the above objects are achieved in accordance with the present invention by providing a method for separating disk-type workpieces from a stack of wafers, comprising providing a stack of disk-type wafer workpieces located in a wafer magazine, and exposing said stacks to a fluid medium flowing out of a nozzle in order for separating and removing an individual wafer workpiece from said stack.

BRIEF DESCRIPTION OF THE DRAWINGS

Other objects and features of the present invention will become apparent from the following detailed description considered in connection with the accompanying drawing which discloses one embodiment of the present invention. It should be understood, however, that the drawing is designed for the purpose of illustration only and not as a definition of the limits of the invention.

In the drawing, only one FIGURE is presented. This FIGURE shows a preferred embodiment of the apparatus, in which the separated wafers are additionally transferred to a tray-filling apparatus by means of a conveying apparatus.

DETAILED DESCRIPTION OF PREFERRED EMBODIMENT

Turning now in detail to the drawing, the FIGURE shows an apparatus in which a stack 1 comprises the disk-type workpieces to be separated, which stack rests in the wafer magazine 2 which is moved by the feed unit 3, and is then separated. It is possible to separate for example, disk-type workpieces composed of semiconductor materials such as silicon, gallium arsenide or indium phosphide, and also of wafers of oxidized material such as gallium gadolinium garnet, ferritic material, sapphire, spinel or glass materials and quartz. However, this separation is also generally possible for disk-type workpieces composed, for example, of plastics or metals. Such stacks of wafers are produced, in particular, upon the sawing of rod-shaped and block-shaped workpieces of single-crystal material such as is produced, for example, according to the Czochralski method or in floating-zone pulling, or polycrystalline material such as is produced, for example, from silicon for solar cell production, by means of multiple cutting methods, for example wire frame sawing. This material is then as a rule still contaminated with residues of the sawing operation, for instance sawdust composed of the sawed material and sawing agents such as, for example, oils, with crystalline admixtures. The invention is furthermore suitable for separating stacked wafers in other stages of the production process, for example cleaned or even post-treated or polished wafers. The wafers may be dry or wet in the stack, but the separation of wafers which are not completely dry is advantageous since wafers which have not yet been cleaned tend to stick together in a dry wafer stack.

As a result of the invention, wafers can be separated regardless of their thickness. In semiconductor technology, wafer thickness of 100 to 1,000 μm are usual, but the separation of wafers which are thinner or thicker than that is also possible. Advantageously, very thin wafers, in particular, in the lower thickness range of up to 200 μm can be separated. In addition to wafer stacks which are comprised by individual wafers, those comprised by wafers joined together, for example by gluing or bonding, can also be separated from non-joined wafers without the bonding or gluing being released.

The wafer stack 1 is introduced into a wafer magazine 2, which is provided with a feed unit 3 in order to bring the uppermost wafer 4 into the range of the separating nozzle system 5. In this operation, the wafer stack may rest directly on the plunger 6 of the feed unit 3, and the stack is then guided by the side plates 7 and the dam 8. In this embodiment, the wafers consequently move upwards relatively to the side plates.

In another embodiment, however, the wafer stack is introduced into a container which is then inserted into the wafer magazine of the separating apparatus and rests on the plunger of the feed unit. This wafer container has side walls for guiding and holding the wafers, is open in the direction of the dam and has an opening or slot on the rear side through which the fluid medium flowing out of the nozzles can act on the wafers. In this embodiment, the wafers do not move relatively to the side walls of the container, but the side walls of the container move relatively to the side plates of the wafer magazine. This has the advantage that lateral jarring and tilting of the wafers can be avoided and the wafer container can be matched to the size and shape of the wafers so that wafers varying with respect to shape and size can be separated with the same separating apparatus. Advantageously, the container has on the bottom a guide unit constructed to fit the plunger exactly, for example, a stud which fits onto a corresponding counterpiece, for example, a corresponding hole in the plunger, in order to prevent the container, for example, from sliding to the side.

The shape of the wafer is not subject to any restriction in the case of the wafers to be separated. The invention is suitable both for the approximately round, or round, wafers normally used in semiconductor technology and for the four-sided, or square, wafers usually used in solar technology. Even wafers of polygonal and other shapes can be separated.

The shape of the wafers does not affect the shaping of the wafer magazine so that, in principle, even round or polygonal wafers existing as a stack, for example, can be separated out of a rectangular wafer magazine. It is, however, advantageous if the wafers are enclosed as closely as possible, in particular in a tolerance range of about 0.5-10 mm, by the walls of the magazine. The dimensioning of the wafer magazine is dependent on the wafer size. It can be freely chosen, with a diameter of 50 to 300 mm as a rule being usual in the case of the round wafers in semiconductor technology. In the case of rectangular, in particular square, wafers, similar edge lengths are usual.

If wafers of different size and diameter are to be separated with one and the same apparatus, the rear wall 9 of the wafer magazine 1, in which the separating nozzle system 5 is located, is advantageously arranged in a displaceable or adjustable manner with respect to the dam 8 in the direction of emergence of the wafers. In the embodiment in which the wafer stack rests directly on the plunger 6 of the feed unit 3, the side plates 7 and the plunger 6 are also advantageously constructed in this case so as to be replaceable or adjustable. This is not necessary in the embodiment in which the wafers are introduced into the wafer magazine of the separating apparatus in a container.

The wafer magazine is equipped with a feed unit 3 which makes it possible to bring the respectively uppermost wafer 4 into the range of the separating nozzle system 5. For this purpose, the feed unit moves, for example, a plunger 6 which comprises a flat plate matched to the shape of the wafer magazine upwards, the wafer mounting or the wafer stack itself resting on the plunger. In principle, the wafer magazine can be fed by hand, but an embodiment is advantageous in which the feed unit is moved mechanically, for example, pneumatically or by a motor, for example an electric motor, in the direction of the separating nozzle system 5. The motor used may be a direct current motor which moves the magazine at constant speed. It is advantageous to use a stepping motor which moves the magazine in steps of approximately one wafer thickness.

The rear wall 9 of the wafer magazine 2 contains, advantageously, approximately opposite the emergence opening for the wafers, and in the most desirable embodiment, at approximately the same height, the separating nozzle system 5 which is connected via a shutoff facility to the feed pipe 10 for the fluid 11.

The fluids used are advantageously liquids which have chemically the desired properties, for example inert properties, in relation to the material of the disk-type workpieces and have a suitable low viscosity for the purpose of establishing the necessary flow conditions. For cost reasons alone, aqueous media, i.e. water and/or aqueous solutions which may, for example, contain chemical reagents and/or rinsing or cleaning agents, are used with particular advantage. However, it is also possible to use other liquids, for example, low-viscosity oils. It has also proved advantageous to filter liquids before use in order to avoid a contamination of the nozzles and, consequently, for example, a deflection or scattering of the nozzle jet. Although the use of gases, for instance compressed air, or for cleanliness reasons, for example, inert gases such as argon or nitrogen, is in principle also possible, it is out of the question if thin wafers, for instance in the range of less than 200 μm, are to be separated. Such thin wafers as a rule tend to vibrate and fracture in the gas stream regardless of the gas pressure, whereas, surprisingly, they can be separated if liquids are used as fluid medium without such vibration phenomena and damage occurring.

The arrangement of the nozzles releasing the fluid used in a particular case into the interior of the wafer magazine is of particular importance. The shape and inside diameter of the nozzles essentially depends on the fluid medium used in a particular case and is expediently optimized for the desired separation conditions in preliminary experiments. As a rule, for example, nozzles having a round cross-section and diameters in the range of 0.1–5 mm, advantageously 0.5 mm, have proved satisfactory, the lower limit generally being governed by the viscosity of the media and the upper limit ultimately by the acceptable flow rates and the available pressure. The smaller the nozzle cross-section, the larger, as a rule, is the thrust intensity. A person skilled in the art can consequently readily match the thrust intensity to the wafers to be separated by regulating the pressure and adjusting the nozzle size. Beneficial results can be achieved using liquid media with operating pressures of up to 20 bar, preferably 0.2 to 8 bar, and in particular, 4 bar. Such pressures can be achieved, for example, by pumps or, in the case of liquid media, high-level tanks.

Instead of nozzles with round cross-section, those with oval, square, rectangular or slit-type cross-section can also be provided. It is generally also possible to influence the emergence characteristic of the medium through the design of the outlet opening in order to provide, for example, full, scattered or sprayed jets of corresponding mixed types.

The rear wall of the wafer magazine contains the nozzle system 5, which preferably has two different types of nozzles, namely conveying nozzles, and separating nozzles. In this connection, at least one separating nozzle is advantageously provided, i.e., one nozzle which is essentially directed at the separating joint between the two uppermost wafers. The fluid it releases undermines the uppermost wafer and lifts it off against the adhesive force, with a fluid cushion being created with respect to the next wafer. It is advantageous to arrange the separating nozzle below the top edge of the oppositely situated dam. In this connection, it has proved particularly beneficial to arrange the separating nozzles at an angle of $-20°$ to $+20°$ with respect to the wafer surface. As many separating nozzles as desired, for example up to 50, can be provided, but 4–20, which are beneficially arranged at a distance of about 1–2 mm from each other, have proved advantageous in relation to the consumption of fluid.

Located above the row of separating nozzles, preferably at about 5 mm distance, is at least one, advantageously several, in particular 2–20, conveying nozzles which are directed at the surface of the wafers at an acute angle so that the fluid flowing out pushes them forward. The angle of the nozzle with respect to the wafer surface affects, in conjunction with the pressure of the fluid, the velocity with which the wafer to be separated leaves the magazine. Angles in the range of 0° to 30°, in particular about 5°–15°, are preferred.

In the separation of contaminated wafers, the fluid, if of suitable composition, for example water with surfactant added, can serve not only to separate the wafers but also to rinse and clean them. Solid and granular constituents can consequently readily be removed by spraying. It is also advantageous to dissolve the contaminants off the surface of the wafers by adding suitable solvents.

The nozzles may, for example, be constantly fed with fluid. Preferable, however, is the cyclic, surge-like use of fluid. For example, the nozzle system can be fed with fluid whenever the wafer stack has exceeded a certain limiting height in the wafer magazine. This can be measured and controlled with suitable sensors, for example, light barriers.

The upper most wafer 4 to be separated leaves the wafer magazine via a stripping edge or dam 8. This is preferably a plate whose upper edge is situated parallel to the lower face of the wafer leaving the magazine. The plate prevents more than one wafer leaving the magazine as a result of the pressure of the fluid exerted from the oppositely situated side of the magazine. Regardless of the shape of the wafers, the dam may be a flat plate perpendicular to the stacking direction, but, in particular embodiments, it may be matched to the shape of the wafers. At the upper edge of the dam, which may come into contact with the bottom of the wafer, a rounded and smoothed construction advantageously ensures that the bottom of the wafer is not damaged. It has also proved beneficial to arrange at least one nozzle in the dam in such a way that a layer of the fluid separates the wafer from the dam when it leaves the magazine.

The shaping of rear wall 9 and side plates 7 of the wafer magazine depends on the embodiment of the apparatus and the shape of the wafers to be separated. If round or polygonal wafers are to be separated, it has proved beneficial to match the rear wall in cross-section to the shape of the wafers and to construct it in a suitably curved or angular shape. The side plates serve to guide the wafers and, in particular embodiments, can then also taper toward each other in a slightly funneled shape in order to make possible an easier entrance of the wafers across the dam. In particular, side plates have proved advantageous which are so shaped that a water pressure, which assists the lifting-off of the uppermost wafer, can build up between the wafers. This is achieved, in particular, by a small distance between the side plates and the disk-shaped workpieces and an almost or completely sealed construction of the wafer magazine for the fluid since the water pressure is then increased.

If the wafer stack is introduced in a wafer holding device, a rectangular shape is advantageously chosen for the wafer magazine since the wafer holding device can be individually matched to the particular shape of the wafers. Rear wall and side plates are then preferably flat plates which are arranged at right angles to each other and to the dam. The same type of apparatus is preferably used when rectangular wafers have to be separated.

It has furthermore proved beneficial to provide a discharge opening and a collecting apparatus for the fluid used. In particular, it is advantageous to surround the entire apparatus with a collecting vessel, for example a trough, in which the liquid released is collected and can be drained off or pumped away. It is furthermore beneficial to filter out solid constituents before removing the liquid.

The apparatus, in particular the wafer magazine 2, the dam 8, the conveying system 12, the processing tray 13, the plunger 6 and the side plates 7, is advantageously manufactured from material which is substantially inert to the particular fluid medium and which also cannot have a contaminating action with respect to the wafers to be separated, conveyed and filled into trays. In particular, plastics have proved satisfactory as wafer magazine 2 for receiving particularly sensitive disk-type workpieces composed of silicon, germanium, gallium arsenide or indium phosphide, and also wafers of oxidized material such as gallium gadolinium garnet, ferritic material, sapphire, spinel or glass materials and quartz. It is possible to use, in particular, polymethylmethacrylate ("plexiglass") but also, for example, polytetrafluoroethylene, polyvinylidene difluoride, ethylenetetrafluoroethylene copolymer and the like. The use of transparent or translucent materials is advantageous since they make it possible in a simple manner to monitor and, optionally, also control the movement of the workpieces or the supply or the drainage of the fluid media used visually and/or by means of optical sensors.

In the case of disk-type workpieces, for which particular cleanliness is important, these constituents may be lined with the material of which the workpiece is composed, in particular, that is to say for silicon wafers for device production where high-purity silicon can be used as lining material. It is also important that the selected material is sufficiently dimensionally stable in order to make possible a precise and dimensionally accurate orientation of the nozzles. It is also important to provide a precise surface treatment so that it is possible to provide, for example by polishing, and to maintain under the operating conditions, a surface of the dam and of the bottom of the wafer magazine, of the conveying system and of the processing tray, which permits a perfect flow of the fluid, which then is flat and is free of unevenness.

In a preferred embodiment, an apparatus 12 for conveying the wafers adjoins the dam 8 over which the wafer 4 leaves the separating apparatus. This may be, for example, a conveying apparatus in which the wafers are moved at rest on two movable belts. Systems of this type are known to the person skilled in the art. Preferred, however, is the conveyance of the wafer with the aid of fluid media, in particular water, as in the exemplary embodiment which is shown in the FIGURE of the drawing. In this case, the wafer can again be moved over the transport path by a fluid medium, for example water, which flows out of nozzles in the base plate and cover plate.

The fluid medium which takes over the conveyance may at the same time be the same as in the separating apparatus. It may, however, be advantageous to use different fluid media, for example if a cleaning process is already to be undertaken with the disk-type workpieces during the conveying operation, in particular if the wafers are separated and conveyed immediately after a sawing process and are still polluted with contaminants due to processing such as sawdust and sawing agent. In this case, the nozzles may be fed, for example, with a solution to which additives such as, for example, surfactants or complexing agents, are added. In another embodiment, instead of liquids, gases which may also be heated may be used as fluid medium in order to achieve a drying of damp wafers simultaneously during the conveyance.

The end of the conveying apparatus preferably contains nozzles which serve to decelerate the disk-type workpieces in order to make possible a gentle transfer of the wafers without damage from the conveying apparatus into the transfer apparatus downstream thereof, for example, a tray-filling apparatus. The spray action of the decelerating nozzles must in that case be directed oppositely to the conveying direction. The extent of the decelerating effect can be determined by the person skilled in the art in suitable preliminary experiments on the basis of pressure and nozzle size.

In the preferred embodiment shown in the FIGURE, the wafers 4 are transferred from the conveying apparatus 12 to a tray-filling apparatus 13. The tray-filling apparatus 13 comprises a processing tray 14 with feed unit 15. The processing trays filled with the disk-type workpieces can then, for example, be removed and used directly as inserts for cleaning or etching baths. The processing tray 14 may, however, also comprise a tray in which the wafers are already stored, for example, for despatch. The feed unit can be operated by hand. The use of a mechanical feed aid, for example, an electric motor, for example a direct current or stepping motor, is again preferred. The feed apparatus may, for example, be controlled by a sensor, in particular an optical sensor, which measures the departure of a wafer from the wafer magazine and which, for example, is coupled to the timer for the fluid so that a selective control of the feed and decelerating nozzles is also possible.

It has been found that in this way, it is possible to build up, immediately after separating the disk-type workpieces from a wafer stack, an entire treatment line in which the wafers consecutively pass through apparatuses fed with alternating fluids and can consequently, for example, be successively etched, rinsed, cleaned and dried, or subjected to other wet-chemical processes.

The invention has the advantages that time-consuming separation of thin wafers by hand, which demands manual skill, is no longer necessary. Unpleasant and monotonous work is consequently avoided. The material consumption as a result of breakage and damage of wafers can be considerably reduced. In particular, in the case of very thin wafers, the danger of damage is considerably reduced. It has also been found that fewer wafers break, especially as a result of separation in a water jet, than if the operation is carried out by hand. Further operations can be eliminated as a result of the possibility of simultaneous cleaning and other treatment steps in a combination of the separating method with the conveying and tray-filling process. The problem of contamination can be almost completely eliminated by using this method, since the material of the disk-type workpieces does not come into contact with foreign bodies at any time. Even when passing over the dam, the wafer is still separated from the material of the dam by a thin layer of fluid so that contamination and damage are eliminated. A further advantage is the easy combinability of the invention with apparatus for further processing steps, which makes possible the setting up of time-saving and labor-saving processing lines.

While only a single embodiment of the present invention has been shown and described, it is to be understood that many changes and modifications may be made thereunto without departing from the spirit and scope of the invention as defined in the appended claims.

What is claimed is:

1. An apparatus for separating semiconductor wafers from a wafer stack having two uppermost wafers and utilizing a liquid medium having a sphere of action, comprising:

a wafer magazine for receiving the wafer stack having a feed unit which brings the uppermost wafer of said wafer stack into the sphere of action of the liquid medium;

a separating nozzle system which is directed at a separating joint between two uppermost wafers of the wafer stack at edges of the two uppermost wafers of the wafer stack, said separating nozzle system releasing the liquid medium to lift off the uppermost wafer of the wafer stack;

a conveying nozzle system which is directed at an acute angle at the surface of the uppermost wafer of the wafer stack, said conveying nozzle system releasing the liquid medium to push the uppermost wafer in a forward direction for leaving out of the wafer magazine, said wafer leaving the magazine having a lower face; and a dam means having an upper edge substantially situated parallel to the lower face of the wafer leaving the magazine, said dam means acting as stripping edge which prevents more than one wafer at a time from leaving the wafer magazine.

2. The apparatus according to claim 1, further comprising a container for receiving the wafer stack, said container being open in the direction of the dam and having an opening which enables the liquid medium released by the nozzle systems to act on the wafer stack.

3. The apparatus according to claim 1, further comprising means for adjusting said wafer magazine to enclose the wafer stack in a tolerance range of about 0.5–10 mm.

4. A method for separating semiconductor wafers from a wafer stack, comprising:

inserting the wafer stack into a wafer magazine, said wafer stack having two uppermost wafers with a separating joint therebetween;

moving the wafer stack in order to bring the uppermost wafer into the range of a separating nozzle system and a conveying nozzle system, each said nozzle system releasing a liquid medium;

directing the liquid medium released by the separating nozzle system at the separating joint between the two uppermost wafers of the wafer stack at edges of the two uppermost wafers of the wafer stack and lifting off the uppermost wafer from the wafer stack by the action of the liquid medium; and directing the liquid medium released by the conveying nozzle system at an acute angle at the surface of the uppermost wafer and conveying said wafer out of the wafer magazine by the action of the liquid medium.

5. The method for separating semiconductor wafers according to claim 4, further comprising introducing the wafer stack into a container; and inserting said container into the wafer magazine.

6. The method for separating semiconductor wafers according to claim 4, further comprising conveying the separated wafer along a transport path by means of nozzles releasing the liquid medium in the conveying direction, said transport path leading to a processing tray;

decelerating the wafer at the end of the transport path by means of nozzles releasing the liquid medium in a direction opposite to the conveying direction; and transferring the wafer in said processing tray.

* * * * *